United States Patent
Choi et al.

(10) Patent No.: US 7,982,223 B2
(45) Date of Patent: Jul. 19, 2011

(54) DISPLAY APPARATUS AND METHOD OF MANUFACTURING THE SAME

(75) Inventors: Seung-Ha Choi, Siheung-si (KR); Min-Seok Oh, Yongin-si (KR); Sang-Gab Kim, Seoul (KR); Hong-Kee Chin, Suwon-si (KR); Yu-Gwang Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 177 days.

(21) Appl. No.: 12/372,212

(22) Filed: Feb. 17, 2009

(65) Prior Publication Data

US 2009/0206343 A1     Aug. 20, 2009

(30) Foreign Application Priority Data

Feb. 14, 2008  (KR) .................. 10-2008-0013573

(51) Int. Cl.
*H01L 29/04* (2006.01)
*H01L 29/10* (2006.01)

(52) U.S. Cl. ............................... 257/72; 257/59

(58) Field of Classification Search .................... 257/59, 257/67, 71, 72, E33.001, E33.053, E33.067
See application file for complete search history.

(56) References Cited

U.S. PATENT DOCUMENTS

| 7,550,327 | B2 * | 6/2009 | Lee et al. | 438/149 |
| 2006/0091396 | A1 * | 5/2006 | Lee et al. | 257/72 |
| 2007/0096097 | A1 * | 5/2007 | Kim et al. | 257/59 |

FOREIGN PATENT DOCUMENTS

| JP | 08240814 | 9/1996 |
| JP | 2004318065 | 11/2004 |
| JP | 2007043131 | 2/2007 |

* cited by examiner

*Primary Examiner* — Hung Vu
(74) *Attorney, Agent, or Firm* — Cantor Colburn LLP

(57) ABSTRACT

In a display apparatus and a method of manufacturing the display apparatus, a first insulating layer having a trench and a second insulating layer having a via hole corresponding to the trench are formed on an array substrate. After forming a seed layer in the trench, a conductive layer is formed on the seed layer through a plating process, thereby forming the gate line, the gate electrode and the storage line accommodated in the trench and the via hole.

17 Claims, 9 Drawing Sheets

DISPLAY APPARATUS AND METHOD OF MANUFACTURING THE SAME

This application relies claims priority to Korean Patent Application No. 2008-13573, filed on Feb. 14, 2008, and all the benefits accruing therefrom under 35 U.S.C. §119, the contents of which in its entirety are herein incorporated by reference.

BACKGROUND OF THE INVENTION

1. Field of the Invention

The present invention relates to a display apparatus and a method of manufacturing the same. More particularly, the present invention relates to a display apparatus including a metal interconnection having a thick thickness and a method of easily forming the metal interconnection having the thick thickness in the display apparatus.

2. Description of the Related Art

A display apparatus displays an image corresponding to an external input signal. In general, the display apparatus includes first and second substrates, which are combined in opposition to each other, and a metal interconnection provided on the first or second substrate to transmit the external input signal to the display apparatus.

In such a display apparatus, the length of the metal interconnection increases as the size of the display apparatus increases. If the length of the metal interconnection increases, resistance of the metal interconnection is also increased, so that electric signals transmitted through the metal interconnection are distorted or interfere with each other. For this reason, various studies are pursued to reduce the resistance of the metal interconnection by increasing the thickness of the metal interconnection, instead of increasing the length of the metal interconnection.

BRIEF SUMMARY OF THE INVENTION

An exemplary embodiment of the present invention provides a display apparatus including a metal interconnection having a thick thickness.

Another exemplary embodiment of the present invention also provides a method of easily forming the metal interconnection having the thick thickness in the display apparatus.

In one aspect, the display apparatus according to exemplary embodiments of the present invention may include a first substrate, a first insulating layer, a second insulating layer, a gate line, a data line, a pixel electrode and a second substrate. The first insulating layer is provided on the first substrate and is formed with a first trench. The second insulating layer is provided on the first insulating layer and is formed with a first via hole that faces the first trench. The gate line is accommodated in the first trench and the first via hole. The data line is provided on the gate line, in which the data line crosses the gate line while being insulated from the gate line. The pixel electrode is provided in a pixel area and the second substrate faces the first substrate.

In another aspect, the display apparatus according to other exemplary embodiments of the present invention may include a first substrate, a first insulating layer, a second insulating layer, a gate line, a data line, a color filter, a pixel electrode and a second substrate.

The first insulating layer is provided on the first substrate and is formed with a first trench. The second insulating layer is provided on the first insulating layer and is formed with a first via hole that faces the first trench. The gate line is accommodated in the first trench and the first via hole. The data line is provided on the gate line, in which the data line crosses the gate line while being insulated from the gate line. The color filter is provided on a pixel area to cover the gate line and the second insulating layer. The pixel electrode is provided in the pixel area, and the second substrate faces the first substrate.

In still another aspect, a method of manufacturing the display apparatus is provided. A first insulating layer is formed on a first substrate. A second insulating layer is formed on the first insulating layer. A via hole is formed in the second insulating layer by etching the second insulating layer. A trench is formed by etching the first insulating layer in correspondence with the via hole. A gate line is accommodated in the via hole and the trench. A data line is formed on the gate line, in which the data line crosses the gate line while being insulated from the gate line. A pixel electrode is formed in a pixel area, and the first substrate is combined with a second substrate.

According to the above, the first insulating layer having the trench and the second insulating layer having the via hole are formed on the substrate, and gate lines are accommodated in the via hole and the trench on the substrate. Thus, the thickness of the gate line may be adjusted by controlling the depth of the via hole and the trench, so that the thickness of the gate line may be easily adjusted.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

Figure 1:
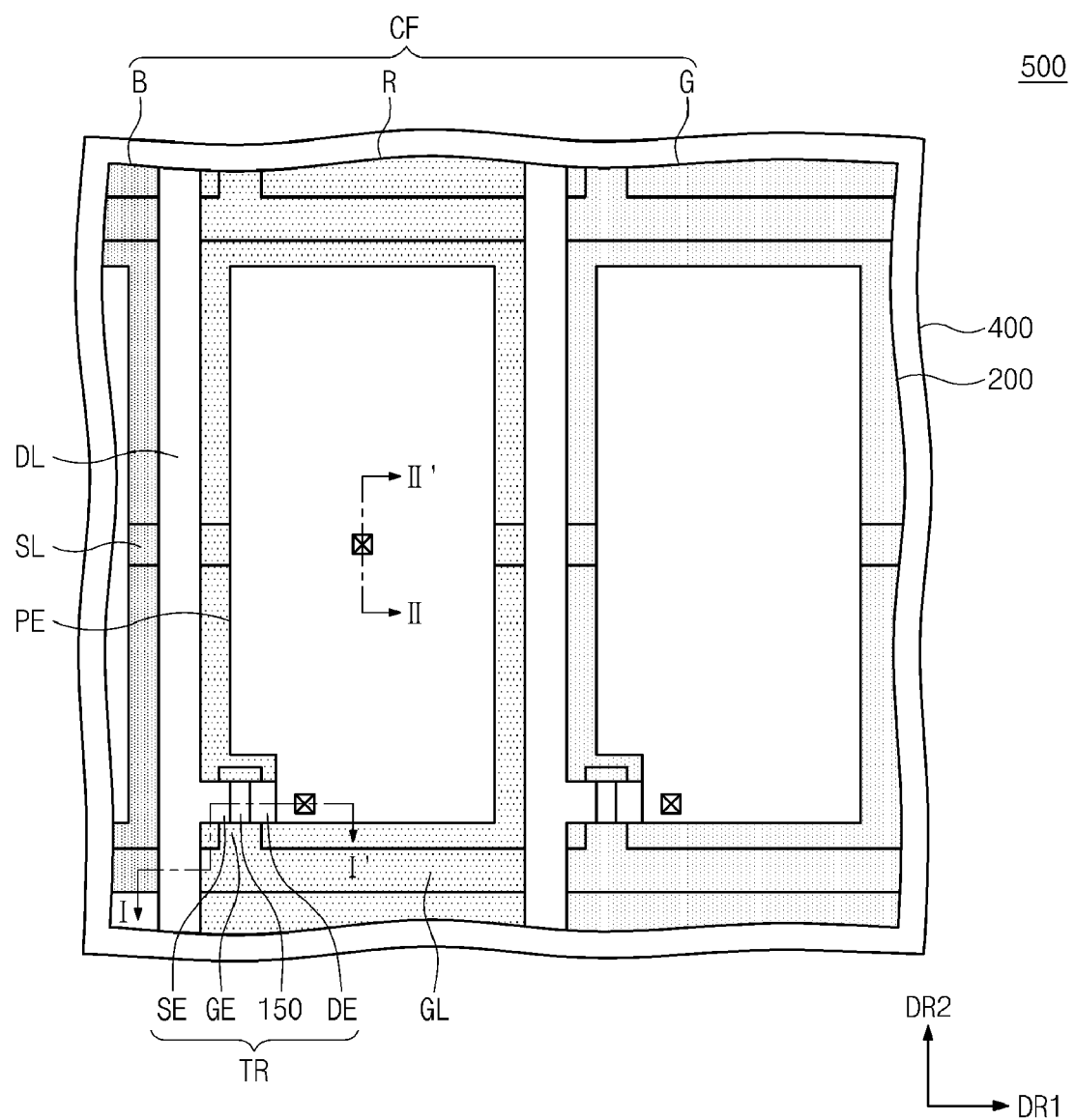
FIG. 1 is a plan view showing an exemplary embodiment of a portion of a liquid crystal display ("LCD") according to the present invention.

Hereinafter, exemplary embodiments of the present invention will be described in detail with reference to accompanying drawings. However, the present invention is not limited to the following embodiments but includes various applications and modifications. The following embodiments are provided to clarify the technical spirit disclosed in the present invention and to sufficiently transmit the technical spirit of the present invention to the one having mean knowledge and skill in this field. Therefore, the scope of the present invention should not be limited to the following embodiments. In addition, the size of the layers and regions of the attached drawings along with the following embodiments are simplified or exaggerated for precise explanation or emphasis and the same reference numeral represents the same component.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. As used herein, the singular forms "a", "an" and "the" are intended to include the plural forms as well, unless the context clearly indicates otherwise.

It will be further understood that the terms "comprises" and/or "comprising" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Hereinafter, the present invention will be explained in more detail with reference to the accompanying drawings.

Figure 2:
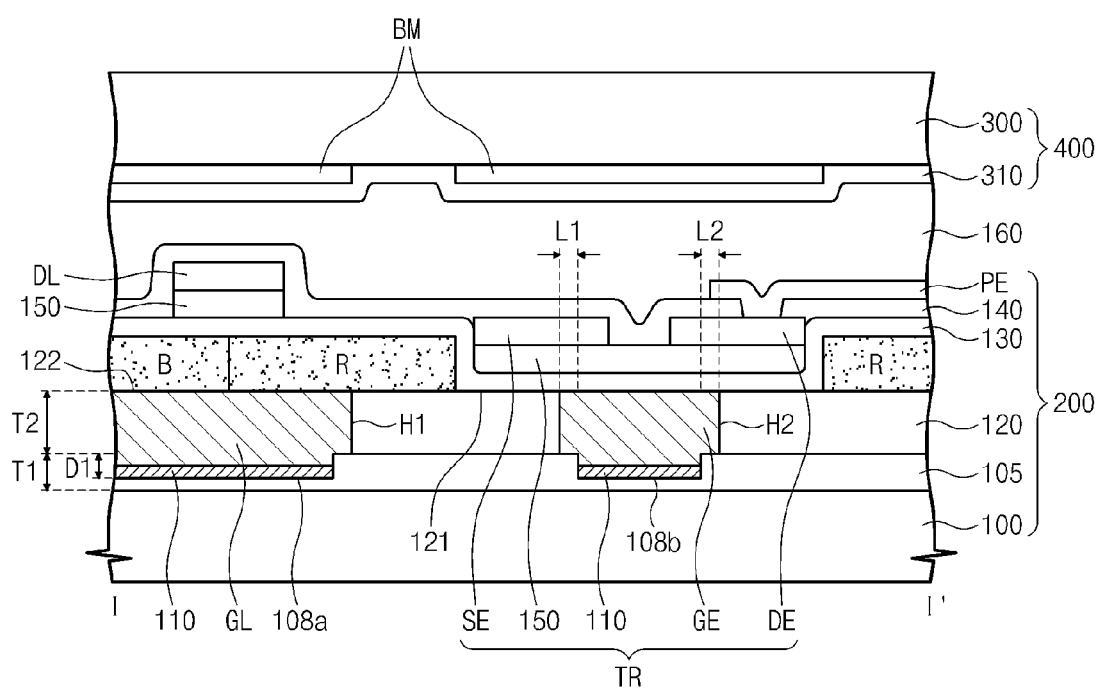
FIG. 2 is a sectional view taken along line I-I' shown in FIG. 1.
Figure 3:
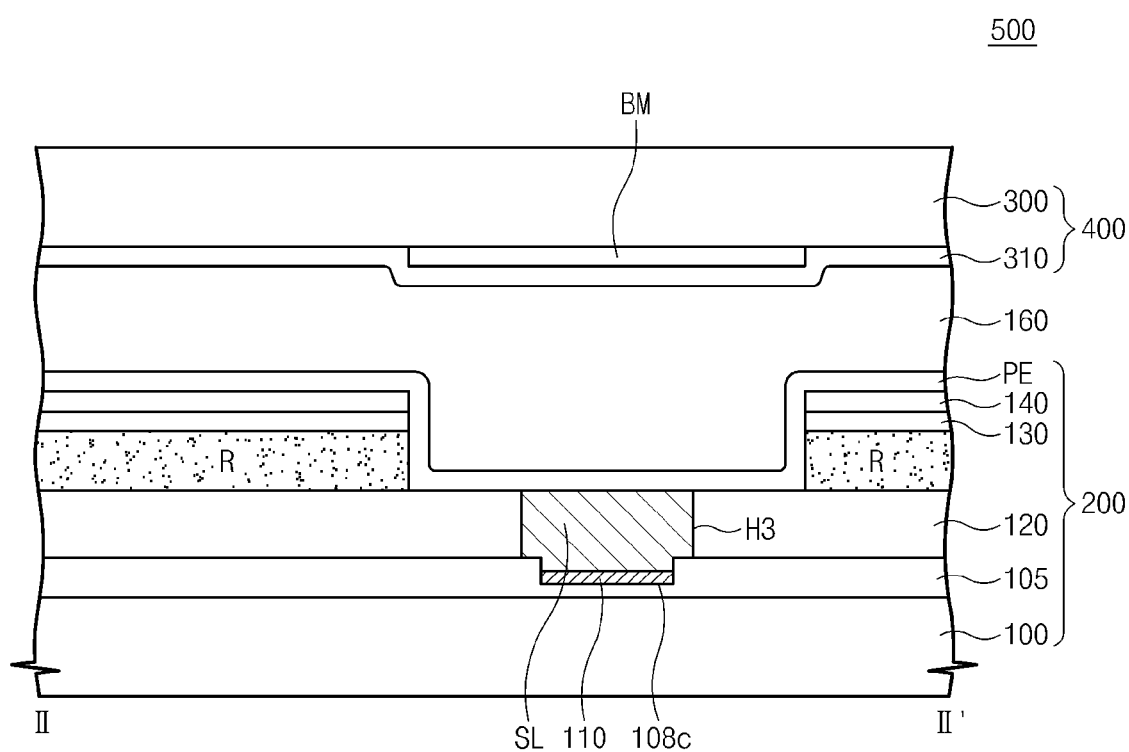
FIG. 3 is a sectional view taken along line II-II' shown in FIG. 1.

FIG. 1 is a plan view showing an exemplary embodiment of a liquid crystal display ("LCD") according to the present invention, FIG. 2 is a sectional view taken along line I-I' shown in FIG. 1, and FIG. 3 is a sectional view taken along line II-II' shown in FIG. 1.

Referring to FIGS. 1 to 3, the LCD 500 includes an array substrate 200, an opposite substrate 400 facing the array substrate 200, and a liquid crystal layer 160 interposed between the array substrate 200 and the opposite substrate 400.

The array substrate 200 includes a first base substrate 100, a thin film transistor ("TFT") TR, a pixel electrode PE, and a color filter CF.

A first insulating layer 105 having a first thickness T1 is provided on the first base substrate 100 to cover the first base substrate 100. The first insulating layer 105 may include silicon nitride (SiNx) or silicon oxide (SiOx).

In the present exemplary embodiment, the first base substrate 100 may include a soda-lime glass substrate. Since the first insulating layer 105 covers the first base substrate 100, alkali ions of the first base substrate 100 are prevented from diffusing into peripheral regions of the first base substrate 100. That is, the first insulating layer 105 may prevent thin films formed on the first base substrate 100 from being separated from the first base substrate 100 by the alkali ions.

A second insulating layer 120 having a second thickness T2 is formed on the first insulating layer 105. The second insulating layer 120 includes a material, which is rapidly etched by etchant as compared with a material of the first insulating layer 105. That is, the second insulating layer 120 has etching selectivity relative to the first insulating layer 105. In more detail, the second insulating layer 120 may be a normal organic layer or a low-K layer. A low-K layer includes a material with a small dielectric constant relative to that of silicon dioxide, where silicon dioxide may have a dielectric constant of 3.9. If the second insulating layer 120 is the low-K layer, the low-K layer may include one of SiOC and SiOF. In this case, the second insulating layer 120 has a dielectric constant less than 3.0, which is relatively lower than that of the first base substrate 100 and the first insulating layer 105.

Meanwhile, if the second insulating layer 120 includes the low-K layer, the dielectric constant of a structure including the first insulating layer 105, the second insulating layer 120 and the first base substrate 100 may be lowered as compared with a case in which the second insulating layer 120 includes the normal organic layer. That is, the dielectric constant of the structure may vary depending on the dielectric constant of the material contained in the second insulating layer 120, so the dielectric constant of the structure may be reduced if the second insulating layer 120 includes the low-K layer. The dielectric constant of the structure may serve as a process factor when forming a plurality of thin films on the structure, which will be described in detail further below with reference to FIG. 4.

The second insulating layer 120 is formed with a first via hole H1, a second via hole H2 and a third via hole H3. The first to third via holes H1 to H3 may be formed by perforating predetermined portions of the second insulating layer 120. In addition, a first trench 108a, a second trench 108b, and a third trench 108c are formed in the first insulating layer 105 in correspondence with the first to third via holes H1 to H3, respectively.

In detail, the first to third via holes H1 to H3 may at least partially overlap with the first to third trenches 108a to 108c, respectively. For instance, when viewed in a plan view, a peripheral portion of the second via hole H2 is spaced apart from a peripheral portion of the second trench 108b by a first distance L1 or a second distance L2. That is, the first to third via holes H1 to H3 may be wider than the first to third trenches 108a to 108c, respectively, such that the first to third trenches 108a to 108c lie within a projection of the first to third via holes H1 to H3, respectively.

According to the present exemplary embodiment, the first and second insulating layers 105 and 120 are patterned by using the same mask pattern and the same etchant, but the etching rate of the first insulating layer 105 is different from the etching rate of the second insulating layer 120 because the material of the first insulating layer 105 is different from the material of the second insulating layer 120, so the peripheral portion of the second via hole H2, for example, is spaced apart from the peripheral portion of the second trench 108b. As the difference in the etching rate between the first and second insulating layers 105 and 120 becomes great, the first distance L1 and the second distance L2 may increase.

In addition, the first to third trenches 108a to 108c may be formed by removing predetermined portions of the first insulating layer 105 such that the first to third trenches 108a to 108c may have a first depth D1. If the second thickness T2 is about 2 μm, the first thickness T1 may be set to from about 300 Å to about 600 Å and the first depth D1 may be set to from about 200 Å to about 400 Å within the range of the first thickness T1. Thus, the first depth D1 of the first to third trenches 108a to 108c is less than the first thickness T1, and the first depth D1 is less than the depth of the first to third via holes H1 to H3, where the depth of the first to third via holes H1 to H3 is equal to the second thickness T2.

As described above, the first insulating layer 105 has etching selectivity relative to the second insulating layer 120. That is, the second insulating layer 120 has the etching rate higher than that of the first insulating layer 105 when the same etchant is applied thereto. Thus, when the first and second insulating layers 105 and 120 are etched by using the etchant, the second insulating layer 120 having the thick thickness may be more rapidly etched than the first insulating layer 105, so that the trenches 108a to 108c may be formed in the first insulating layer 105, which will be described later in more detail with reference to FIGS. 5 and 6.

A conductive layer 110 is formed on bottom portions of the first to third trenches 108a to 108c, respectively. The conductive layer 110 may include molybdenum (Mo) and serve as a seed layer for a gate line GL, a gate electrode GE, and a storage line SL, which will be described later in more detail with reference to FIG. 9.

The gate line GL, gate electrode GE, and storage line SL are formed on the conductive layer 110, so that the gate line GL is accommodated in the first trench 108a and the first via hole H1, the gate electrode GE is accommodated in the second trench 108b and the second via hole H2, and the storage line SL is accommodated in the third trench 108c and the third via hole H3. The gate line GL, gate electrode GE, and storage line SL may include the same material, such as, but not limited to, copper (Cu).

Meanwhile, an upper surface 122 of the gate line GL is positioned on the same plane with an upper surface 121 of the second insulating layer 120, such that the upper surfaces 121 and 122 are at least substantially coplanar. Thus, flatness of other thin films formed on the gate line GL may be improved. As a result, cracks may be prevented from occurring at bending portions of the thin films.

In order to improve the flatness, the first depth D1 or the second thickness T2 may be adjusted according to the thickness of the gate line GL. For instance, if the thickness of the gate line GL is to be about 2 μm, the sum of the first depth D1 and the second thickness T2 must be adjusted to total about 2 μm. To this end, the thickness of the second insulating layer 120 and the depth of the first trench 108a may be adjusted. In other words, the flatness of the thin films formed on the gate line GL may be improved by adjusting the second thickness T2 and the first depth D1, and simultaneously, the thickness of the gate line GL may be easily adjusted.

The length of the gate line GL may increase according to an increase of the size of the LCD 500, so the resistance of the gate line GL may increase. As a result, intensity of the gate signal transferred through the gate line GL may be attenuated, causing degradation in display quality of the LCD 500. However, if the thickness of the gate line GL is increased, instead of or in addition to increasing the length of the gate line GL, the resistance of the gate line GL may be reduced. Therefore, if the thickness of the gate line GL is adjusted by adjusting the second thickness T2 and the first depth D1, the resistance of the gate line GL may be reduced. In this case, the display quality of the LCD 500 may not be degraded.

The color filter CF is provided on the first base substrate 100 to cover the gate line GL, the gate electrode GE, and the storage line SL. In the exemplary embodiment, the color filter CF includes a red filter R, a green filter G and a blue filter B. A predetermined portion of the red filter R may be removed corresponding to the position of the TFT TR, or a predetermined portion of the red filter R may be removed such that the storage line SL may be partially exposed and electrically connected to the pixel electrode PE.

A gate insulating layer 130 is formed on the color filter CF, and on the underlying second insulating layer 120 and gate electrode GE exposed by openings in the color filter CF, and data lines DL are formed on the gate insulating layer 130. In addition, the transistor TR including a source electrode SE, a drain electrode DE, and an amorphous silicon ("a-Si") layer 150 is formed on the gate insulating layer 130. The a-Si layer may be interposed between the data lines DL and the gate insulating layer 130.

The data lines DL extend in a second direction DR2, which is perpendicular to a first direction DR1, while crossing the gate lines GL. Although not shown in FIG. 1 in detail, pixels are formed in pixel areas to display images on the LCD 500, so each pixel area is regarded as an area where the pixel electrode PE is provided. In an exemplary embodiment, the data lines DL and gate lines GL define the pixel areas, although the pixel areas may also be otherwise provided.

In addition, the source electrode SE and the drain electrode DE include a material identical to the material of the data line DL. The source electrode SE branches from the data line DL and the drain electrode DE is spaced apart from the source electrode SE.

The a-Si layer 150 overlaps with the gate electrode GE and is aligned below the source electrode SE and the drain electrode DE. The a-Si layer 150 serves as an active pattern of the TFT TR.

In the present exemplary embodiment, the same mask is employed when etching the data line DL and the a-Si 150.

An interlayer dielectric layer 140 is formed on the first base substrate 100 to cover the TFT TR and the data line DL, and the pixel electrode PE is formed on the interlayer dielectric layer 140. The interlayer dielectric layer 140 is partially removed to expose the drain electrode DE. The exposed drain electrode DE is electrically connected to the pixel electrode PE. The pixel electrode PE may include a transparent conductive material, such as indium tin oxide ("ITO") or indium zinc oxide ("IZO").

The opposite substrate 400 includes a second base substrate 300, a black matrix BM and a common electrode 310.

The second base substrate 300 may include a transparent glass substrate, such as a soda-lime glass substrate. The black matrix BM may include a light-blocking material. The black matrix BM is formed on the second base substrate 300 in portion of the second base substrate 300 that correspond to the data line DL, the gate line GL, the TFT TR and the storage line SL when the opposite substrate 400 is combined with the array substrate 200.

Similar to the pixel electrode PE, the common electrode 310 may include a transparent conductive material. The common electrode 310 forms an electric field together with the pixel electrode PE to control the alignment of liquid crystals contained in the liquid crystal layer 160.

FIGS. 4 to 14 are sectional views showing an exemplary method of manufacturing the exemplary LCD shown in FIG. 1. These sectional views are taken along line I-I' of the LCD 500 (see FIG. 1) to illustrate the exemplary manufacturing steps for the LCD 500. In FIGS. 4 to 14, the same reference numerals denote the same elements shown in FIGS. 1 to 3, and thus the detailed descriptions of the same elements will be omitted in order to avoid redundancy.

Figure 4:
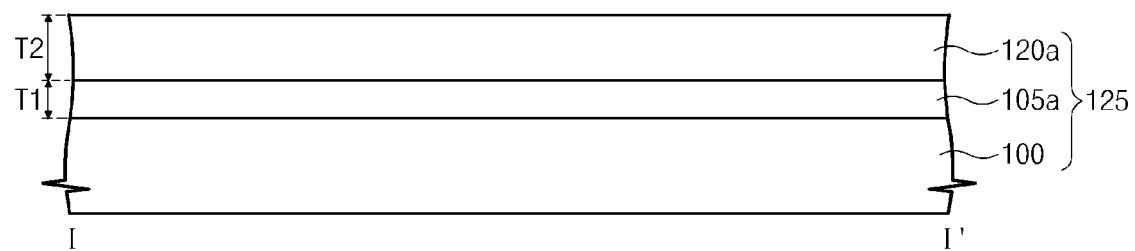
FIGS. 4 to 14 are sectional views showing an exemplary method of manufacturing the exemplary LCD shown in FIG. 1.

Referring to FIG. 4, a first preliminary insulating layer 105a having a first thickness T1 is formed on the first base substrate 100 including the soda-lime glass substrate, and a second preliminary insulating layer 120a having a second thickness T2 is formed on the first preliminary insulating layer 105a, thereby forming a multi-layer base substrate 125.

The first preliminary insulating layer 105a may include SiNx or SiOx, and the second preliminary insulating layer 120a includes a material which is rapidly etched by etchant as compared with a material of the first preliminary insulating layer 105a. That is, the second preliminary insulating layer 120a has etching selectivity relative to the first preliminary insulating layer 105a. In more detail, the second preliminary insulating layer 120a may be a normal organic layer or a low-K layer. If the second preliminary insulating layer 120a is the low-K layer, the low-K layer may include one of SiOC and SiOF. In this case, the second preliminary insulating layer 120a has a dielectric constant less than about 3.0, which is relatively lower than that of the first base substrate 100 and the first preliminary insulating layer 105a.

Meanwhile, if the second preliminary insulating layer 120a includes the low-K layer, the dielectric constant of the multi-layer base substrate 125 may be lowered as compared with a case in which the second preliminary insulating layer 120a includes the normal organic layer. That is, the dielectric constant of the multi-layer base substrate 125 may vary depending on the dielectric constant of the second preliminary insulating layer 120a. In particular, in the present exemplary embodiment, the first base substrate 100 includes a soda-lime glass substrate, which is cheaper than other glass substrates and has a relatively higher dielectric constant of about 9.0. However, even when the multi-layer base substrate 125 includes the first base substrate 100 in the form of the soda-lime glass substrate, the dielectric constant of the multi-layer base substrate 125 may be lowered, if the second preliminary insulating layer 120a includes the low-K layer.

In general, when patterning the thin films formed directly on the soda-lime glass substrate, various problems may occur due to the high dielectric constant of the soda-lime glass substrate. In more detail, when etching the thin films formed directly on the soda-lime glass substrate by using dry-etching equipment including two electrodes charged with different polarities, the soda-lime glass substrate interposed between the two electrodes is influenced by the electric field generated between the two electrodes. If the soda-lime glass substrate is subject to the electric field, the soda-lime glass substrate may adhere to one of the two electrodes due to electrostatic attractive force defined by the following Equation 1. As a result, the soda-lime glass substrate may be damaged when the soda-lime glass substrate is separated from the electrodes.

$$F = \frac{1}{2}(\in^2 \times E^2 \times A)$$  Equation 1

In Equation 1, F is electrostatic attractive force, $\in$ is a dielectric constant of the soda-lime glass substrate, E is an electric field, and A is an area of the soda-lime glass substrate. Referring to Equation 1, according to the present exemplary embodiment, even when the multi-layer base substrate 125 includes the first base substrate 100 in the form of the soda-lime glass substrate, the dielectric constant of the multi-layer base substrate 125 may be lowered, if the second preliminary insulating layer 120a including the low-K layer is formed on the first base substrate 100. Therefore, the multi-layer base substrate 125 may be prevented from being damaged by the electrostatic attractive force when etching the thin films formed on the multi-layer base substrate 125.

Meanwhile, if the second preliminary insulating layer 120a includes one of SiOC and SiOF, the second preliminary insulating layer 120a can be rapidly formed on the first base substrate 100 as compared with the first preliminary insulating layer 105a. In addition, the second thickness T2 may be determined according to the thickness of the gate line GL (see FIG. 2). Thus, even if the second thickness T2 is increased due to the thick thickness of the gate line GL, the second preliminary insulating layer 120a may be easily formed since the second preliminary insulating layer 120a is rapidly formed on the first base substrate 100.

Figure 5:
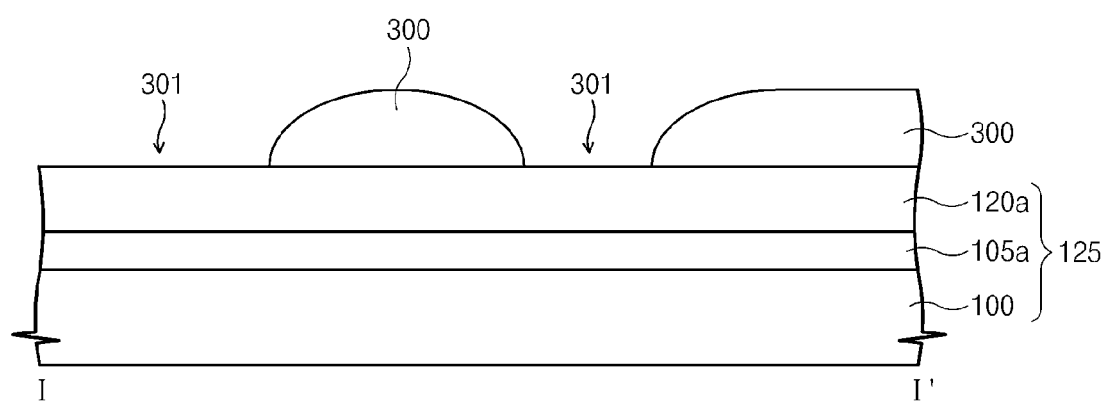

Referring to FIG. 5, a mask pattern 300 is formed on the first base substrate 100 having the first preliminary insulating layer 105a (see FIG. 4) and the second preliminary insulating layer 120a (see FIG. 4) formed thereon. The mask pattern 300 may include a photoresist film. In more detail, after coating the photoresist film on the second preliminary insulating layer 120a, an exposure and development process is performed relative to the photoresist film, thereby forming the mask pattern 300.

Referring again to FIG. 5, the mask pattern 300 has openings 301 corresponding to locations where the gate lines GL and the gate electrode GE are to be formed. In addition, although not shown in FIG. 5, since the storage lines SL (see FIG. 3) are formed simultaneously with the gate lines GL and the gate electrode GE, the mask pattern 300 has openings corresponding to the storage lines SL.

Figure 6A:
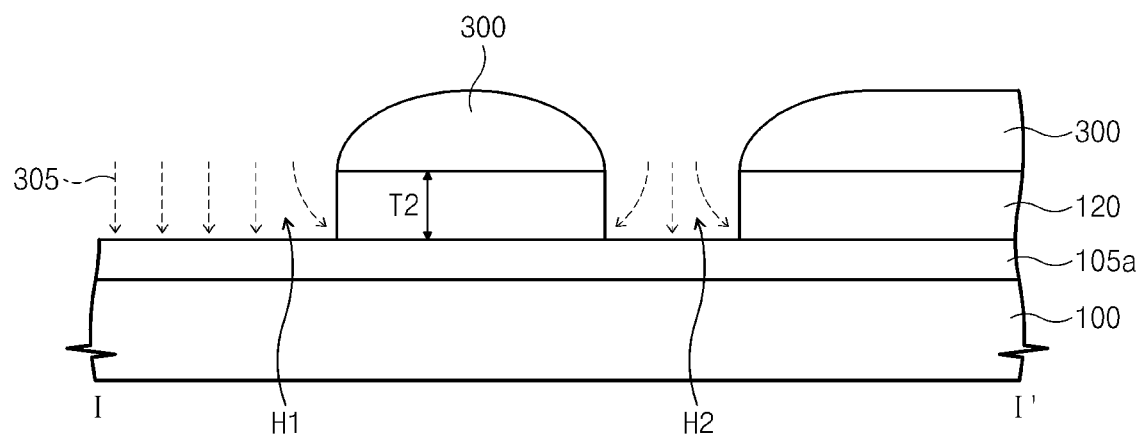
Figure 6B:
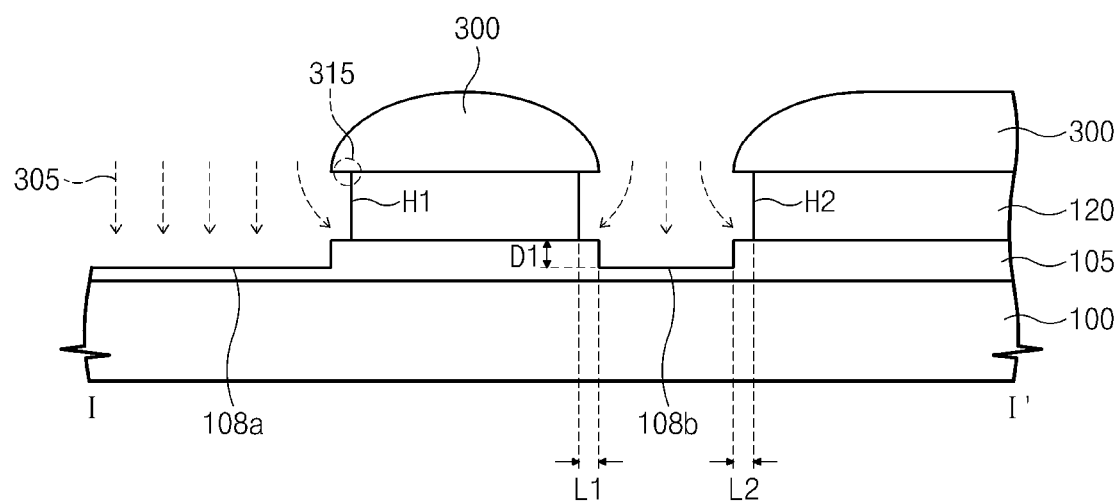

Referring to FIGS. 5, 6A and 6B, the second preliminary insulating layer 120a having the mask pattern 300 formed thereon is isotropically etched by using an etchant 305, so that exposed portions of the second preliminary insulating layer 120a are removed. As a result, the first and second via holes H1 and H2 are formed in the second preliminary insulating layer 120a, so that the second insulating layer 120 is formed. Although not shown in FIG. 6A, the third via holes H3 are also formed. Since the first and second via holes H1 and H2 are formed through the second preliminary insulating layer 120a, the depth of the first and second via holes H1 and H2 is identical to the second thickness T2 of the second preliminary insulating layer 120a.

After forming the second insulating layer 120 by etching the second preliminary insulating layer 120a, the first preliminary insulating layer 105a is etched by using the mask pattern 300, thereby forming the first insulating layer 105. The first and second trenches 108a and 108b are formed in the first insulating layer 105, and the first and second trenches 108a and 108b may have the first depth D1, respectively. Although not shown in FIG. 6B, the third trenches 108c are also formed. In the case that the second thickness T2 is about 2 μm, the first thickness T1 may be set to from about 300 Å to about 600 Å and the first depth D1 may be set to from about 200 Å to about 400 Å within the range of the first thickness T1.

As shown in FIG. 6B, while the first preliminary insulating layer 105a is being etched by the etchant 305, the sidewall of the second insulating layer 120 may be etched as well, so that an undercut 315 is formed.

As mentioned above, the second preliminary insulating layer 120a has the etching rate higher than that of the first preliminary insulating layer 105a when the same etchant 305 is applied thereto. Thus, when the first and second preliminary insulating layers 105a and 120a are etched by using the etchant 305, the second preliminary insulating layer 120a having the thick thickness may be more rapidly etched than the first preliminary insulating layer 105a, so that the first and second via holes H1 and H2 are easily formed. In addition, since the first preliminary insulating layer 105a is slowly etched, the first and second trenches 108a and 108b may be easily formed.

In addition, since the second preliminary insulating layer 120a has the etching rate higher than that of the first preliminary insulating layer 105a when the same etchant 305 is applied thereto, when viewed in a plan view, a peripheral portion of the second via hole H2 is spaced apart from a peripheral portion of the second trench 108b by a first distance L1 or a second distance L2. As the difference in the etching rate between the first and second preliminary insulating layers 105a and 120a becomes great, the first distance L1 and the second distance L2 may increase. Thus, the first to third via holes H1 to H3 are wider than the first to third trenches 108a to 108c.

Figure 7:
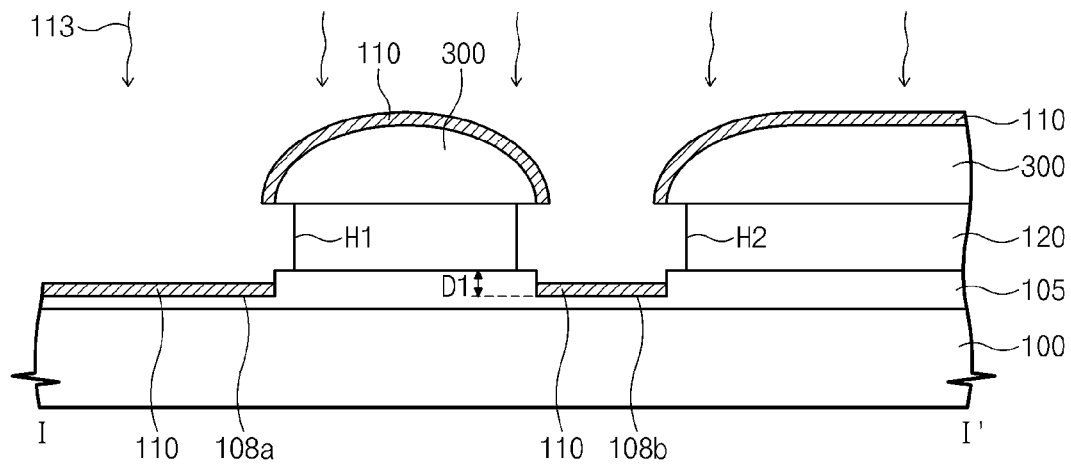

Referring to FIG. 7, a conductive material 113 is supplied to the first base substrate 100 having the first and second insulating layers 105 and 120 and the mask pattern 300. The conductive material 113 may include molybdenum (Mo) and may be provided onto the first base substrate 100 through an anisotropic process, such as a sputtering process. As a result, a conductive layer 110 including the conductive material 113 is formed on the mask pattern 300. The conductive material 113 is also filled in the first and second trenches 108a and 108b, thereby forming the conductive layer 110. Although not shown in FIG. 7, the conductive material 113 is also filled in the third trenches 108c.

Figure 8:
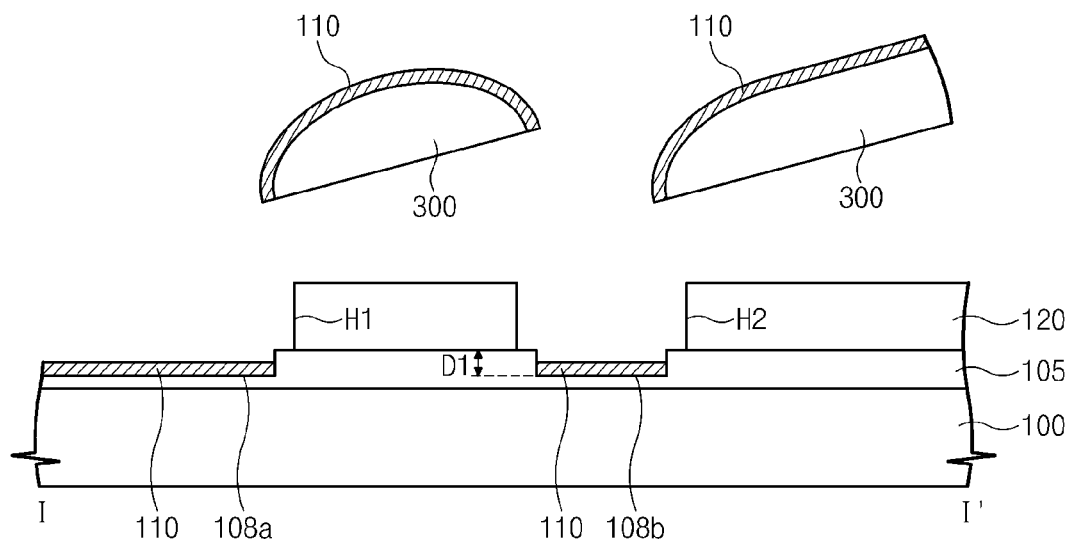

Referring to FIG. 8, the mask pattern 300 having the conductive layer 110 is removed from the first base substrate 100. In the present exemplary embodiment, the mask pattern 300 may be removed through a lift-off method.

If the mask pattern 300 is removed from the first base substrate 100, the conductive layer 110 formed on the mask pattern 300 is also removed from the first base substrate 100, so that only the conductive layer 110 filled in the first and second trenches 108a and 108b, and the third trenches 108c, may remain on the first base substrate 100.

Figure 9:
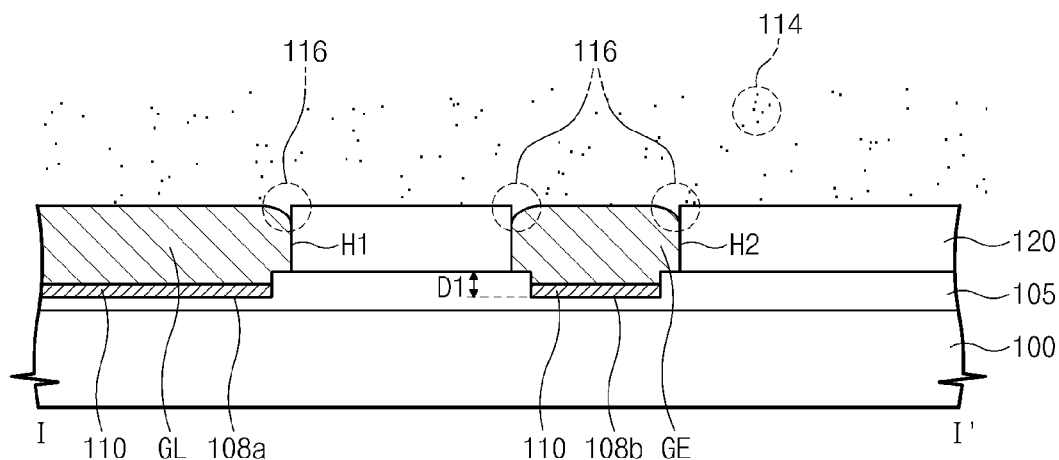

Referring to FIG. 9, the conductive layer 110 filled in the first and second trenches 108a and 108b makes contact with a plating solution 114 through a plating process, so that a conductive film is grown from the conductive layer 110. Although not shown in FIG. 9, the conductive layer 110 filled in the third trenches 108c also makes contact with the plating solution 114. As a result, the gate line GL is accommodated in the first trench 108a and the first via hole H2, and the gate electrode GE is accommodated in the second trench 108b and the second via hole H2. Also, the storage line SL is accommodated in the third trench 108c and the third via hole H3. Thus, it should be understood that the conductive layer 110 formed in the first to third trenches 108a to 108c is interposed between the first insulating layer 105 and the gate line GL, gate electrode SE and storage line SL. Since the gate line GL, gate electrode GE, and storage line SL are grown from the conductive layer 110, the gate line GL, gate electrode GE, and storage line SL are also accommodated in the first to third trenches 108a to 108c in addition to being accommodated in the first to third via holes H1 to H3, respectively. The gate line GL and the gate electrode GE and the storage line SL may include copper and the plating solution 114 may include copper ions to extract copper when the plating solution 114 makes contact with the conductive layer 110.

Since the conductive film is isotropically grown on the conductive layer 110, upper surfaces of the gate line GL and the gate electrode GE have rounded shapes, so that grooves 116 may be formed at edges thereof. The grooves 116 may deteriorate the flatness of films formed on the gate line GL and the gate electrode GE. However, since the color filter CF (see FIG. 1) is formed on the gate electrode GE and the gate line GL by using a slit nozzle 220 (shown in FIG. 10), the flatness of the films may be improved, which will be described in detail with reference to FIG. 10.

Figure 10:
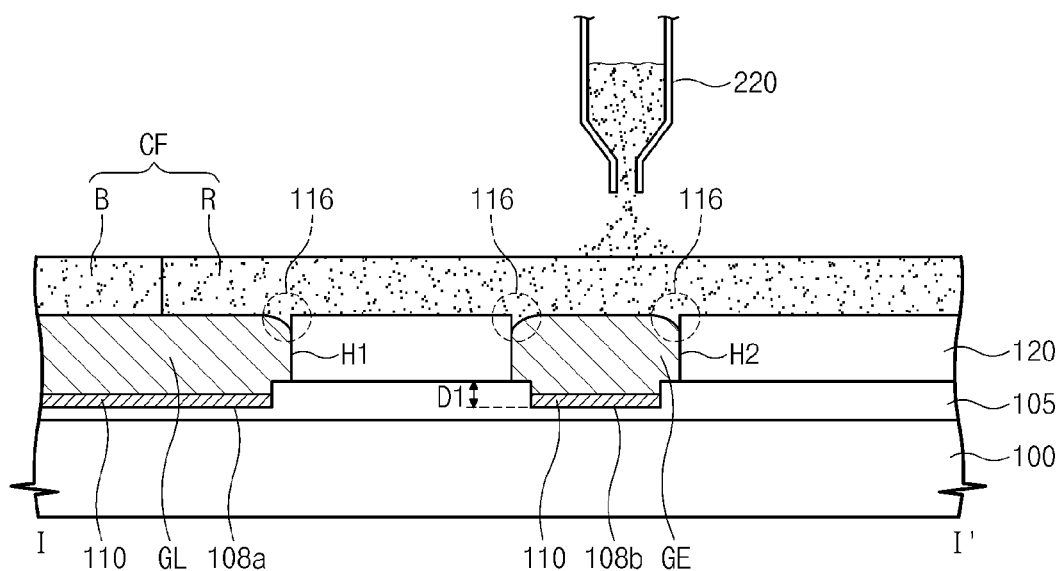

Referring to FIG. 10, the color filter CF is formed on the gate electrode GE and the gate line GL by using the slit nozzle 220. In more detail of an exemplary embodiment, after filling the slit nozzle 220 with a blue filter solution, the blue filter solution is supplied to the first substrate 100 to form the blue filter B on the first base substrate 100. In addition, after forming the blue filter B on the first base substrate 100, the red filter R and the green filter G (see FIG. 1) may be formed on the first base substrate 100 in the same way described above.

If the color filter CF is formed by using the slit nozzle 220, the grooves 116 formed at edge portions of the gate electrode GE and the gate line GL are filled with the color filter CF. Thus, the flatness of the color filter CF as well as the thin films formed on the gate line GL and the gate electrode GE may be improved.

Figure 11:
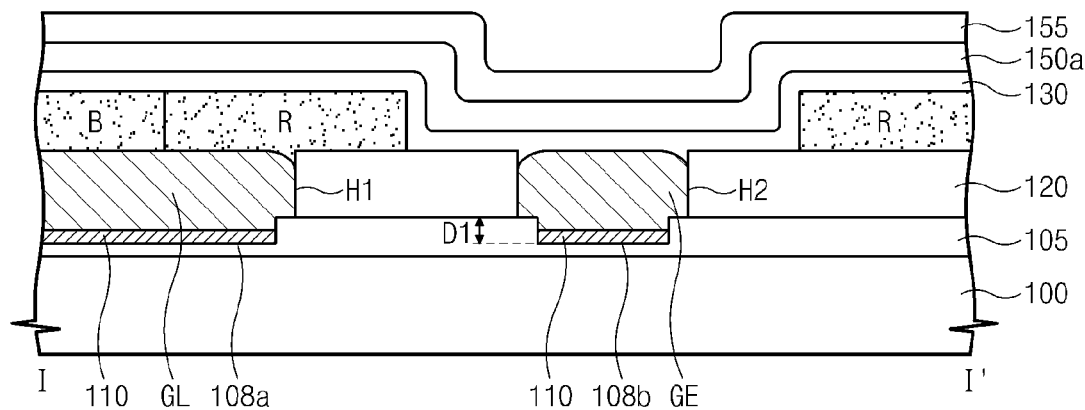
Figure 12:
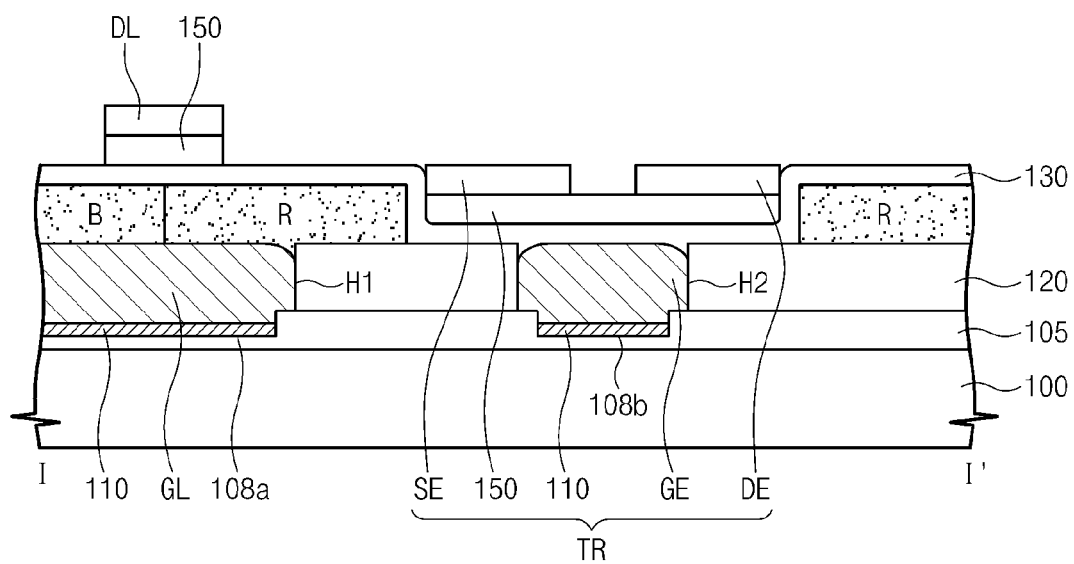

Referring to FIGS. 11 and 12, after removing a portion of the red filter R that overlaps with the gate electrode GE, the gate insulating layer 130, a preliminary a-Si layer 150a, and a preliminary source-drain layer 155 are sequentially formed on the first base substrate 100. Although not shown in the drawings, an ohmic contact layer may be further interposed between the gate insulating layer 130 and the preliminary source-drain layer 155.

After forming the preliminary a-Si layer 150a and the preliminary source-drain layer 155, a patterning process is performed relative to the preliminary a-Si layer 150a and the preliminary source-drain layer 155, so that the data line DL, the source electrode SE and the drain electrode DE are formed. As a result, the TFT TR including the gate electrode GE, which is formed at a bottom thereof with the conductive layer 110, the source electrode SE, the drain electrode DE and the a-Si layer 150 may be obtained.

According to the exemplary embodiment of the present invention, the preliminary a-Si layer 150a and the preliminary source-drain layer 155 are simultaneously patterned by using a slit mask or a halftone mask. As a result, the a-Si layer 150 is positioned below the data line DL, except for a channel area of the TFT TR. According to another exemplary embodiment of the present invention, the preliminary a-Si layer 150a and the preliminary source-drain layer 155 may be patterned separately from each other through the photolithography process.

Figure 13:
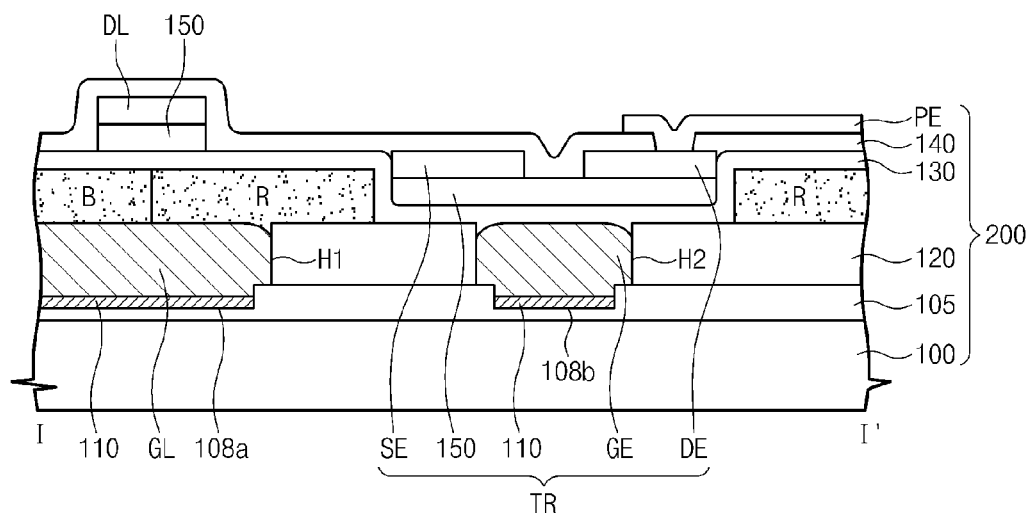

Referring to FIG. 13, after forming the TFT TR on the first base substrate 100, the interlayer dielectric layer 140 is formed on the first base substrate 100 to cover the data line DL and the TFT TR, as well as exposed portions of the gate insulating layer 130. The interlayer dielectric layer 140 is partially removed to expose a portion of the drain electrode DE.

Then, the pixel electrode PE is formed on the interlayer dielectric layer 140, thereby forming the array substrate 200. The pixel electrode PE is formed in a pixel area and in the region where the interlayer dielectric layer 140 is removed, so that the pixel electrode PE may be electrically connected to the drain electrode DE.

Figure 14:
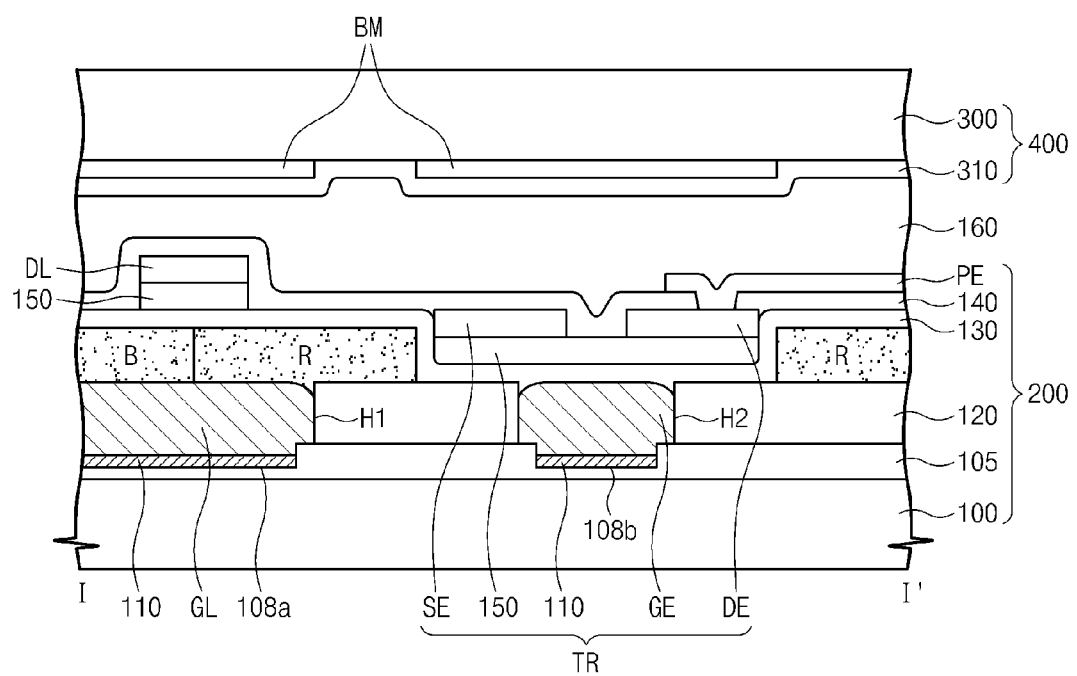

Referring to FIG. 14, the liquid crystal layer 160 is formed on the array substrate 200 and then the array substrate 200 is combined with the opposite substrate 400.

The opposite substrate 400 may be formed with the black matrix BM corresponding to the data line DL and the TFT TR. In addition, the common electrode 310 is formed on the opposite substrate 400. The common electrode 310 forms the electric field together with the pixel electrode PE to control the alignment of liquid crystals contained in the liquid crystal layer 160.

According to the display apparatus and the method of manufacturing the same, the first insulating layer having the trench and the second insulating layer having the via hole are formed on the base substrate of an array substrate of the display apparatus, and gate lines are accommodated in the via hole and the trench on the base substrate. Thus, the thickness of the gate line may be adjusted by controlling the depth of the via hole and the trench, so that the thickness of the gate line may be easily adjusted.

Although exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A display apparatus comprising:
   a first substrate;
   a first insulating layer provided on the first substrate and formed with a first trench;
   a second insulating layer provided on the first insulating layer and formed with a first via hole that faces the first trench;
   a gate line accommodated in the first trench and the first via hole;
   a data line provided on the gate line, in which the data line crosses the gate line while being insulated from the gate line;
   a pixel electrode provided in a pixel area; and
   a second substrate facing the first substrate.

2. The display apparatus as claimed in claim 1, wherein the second insulating layer has an etching selectivity relative to the first insulating layer.

3. The display apparatus as claimed in claim 2, wherein the second insulating layer comprises at least one of SiOC, SiOF, and an organic substance.

4. The display apparatus as claimed in claim 3, wherein the first insulating layer comprises at least one of SiOx and SiNx.

5. The display apparatus as claimed in claim 1, wherein the first substrate comprises a soda-lime glass substrate.

6. The display apparatus as claimed in claim 5, wherein the second insulating layer has a dielectric constant lower than a dielectric constant of the first substrate.

7. The display apparatus as claimed in claim 1, further comprising a conductive layer accommodated in the first trench and interposed between the first insulating layer and the gate line.

8. The display apparatus as claimed in claim 1, wherein the first via hole is wider than the first trench, and has a depth equal to a thickness of the second insulating layer, and the first trench has a depth less than a thickness of the first insulating layer.

9. A display apparatus comprising:
   a first substrate;
   a first insulating layer provided on the first substrate and formed with a first trench;
   a second insulating layer provided on the first insulating layer and formed with a first via hole that faces the first trench;
   a gate line accommodated in the first trench and the first via hole;
   a data line provided on the gate line, in which the data line crosses the gate line while being insulated from the gate line;
   a color filter provided in a pixel area to cover the gate line and the second insulating layer;
   a pixel electrode provided in the pixel area; and
   a second substrate facing the first substrate.

10. The display apparatus as claimed in claim 9, further comprising:
    a thin film transistor provided in the pixel area and electrically connected to the pixel electrode; and
    a storage line accommodated in a second trench formed in the first insulating layer and a second via hole in the second insulating layer that faces the second trench, wherein
    the thin film transistor comprises:
    a gate electrode that branches from the gate line and is accommodated in a third trench formed in the first insulating layer and a third via hole in the second insulating layer that faces the third trench;
    an active pattern that overlaps with the gate electrode;
    a source electrode that branches from the data line; and
    a drain electrode spaced apart from the source electrode.

11. The display apparatus as claimed in claim 9, wherein the second insulating layer has an etching selectivity relative to the first insulating layer.

12. The display apparatus as claimed in claim 11, wherein the second insulating layer comprises at least one of SiOC, SiOF, and an organic substance.

13. The display apparatus as claimed in claim 12, wherein the first insulating layer comprises at least one of SiOx and SiNx.

14. The display apparatus as claimed in claim 9, wherein the color filter is disposed between the gate line and the data line, and a surface of the color filter is substantially flat.

15. The display apparatus as claimed in claim 9, wherein the first substrate comprises a soda-lime glass substrate.

16. The display apparatus as claimed in claim 9, further comprising a conductive layer accommodated in the first trench and interposed between the first insulating layer and the gate line.

17. The display apparatus as claimed in claim 9, wherein the first substrate comprises a soda-lime glass substrate, and the second insulating layer has a dielectric constant lower than a dielectric constant of the first substrate.

* * * * *